United States Patent
Hoirup et al.

(10) Patent No.: US 11,791,852 B2
(45) Date of Patent: Oct. 17, 2023

(54) ANTENNA TUNER FOR A BEAMFORMING ANTENNA ARRAY

(71) Applicant: NXP USA, Inc., Austin, TX (US)

(72) Inventors: Carsten Hoirup, Raleigh, NC (US); Matthew Russell Greene, Crystal Lake, IL (US)

(73) Assignee: NXP USA, Inc., Austin, TX (US)

( * ) Notice: Subject to any disclaimer, the term of this patent is extended or adjusted under 35 U.S.C. 154(b) by 150 days.

(21) Appl. No.: 17/227,479

(22) Filed: Apr. 12, 2021

(65) Prior Publication Data
US 2022/0328964 A1    Oct. 13, 2022

(51) Int. Cl.
| | |
|---|---|
| H04B 1/04 | (2006.01) |
| H01B 1/18 | (2006.01) |
| H03H 7/40 | (2006.01) |
| H01Q 3/24 | (2006.01) |
| H01Q 5/50 | (2015.01) |
| H04B 1/48 | (2006.01) |
| H03J 3/00 | (2006.01) |
| H04B 1/18 | (2006.01) |
| H04B 7/06 | (2006.01) |

(52) U.S. Cl.
CPC ............. *H04B 1/0458* (2013.01); *H01Q 3/24* (2013.01); *H01Q 5/50* (2015.01); *H03H 7/40* (2013.01); *H03J 3/00* (2013.01); *H04B 1/18* (2013.01); *H04B 1/48* (2013.01); *H04B 7/0695* (2013.01)

(58) Field of Classification Search
CPC .......... H04B 1/04; H04B 1/0458; H04B 1/18; H04B 1/48; H04B 7/06; H04B 7/0695; H04B 2001/0408; H01Q 3/24; H01Q 3/247; H01Q 5/50; H03H 7/38; H03H 7/40; H03H 2007/386; H03J 3/00
See application file for complete search history.

(56) References Cited

U.S. PATENT DOCUMENTS

| | | | |
|---|---|---|---|
| 3,794,941 A * | 2/1974 | Templin | H03H 7/40 327/236 |
| 4,682,176 A | 7/1987 | Jones | |
| 8,594,584 B2 | 11/2013 | Greene et al. | |
| 8,975,981 B2 * | 3/2015 | See | H03H 7/38 333/32 |
| 9,077,426 B2 * | 7/2015 | Ali | H04B 1/18 |
| 9,671,765 B2 | 6/2017 | Manssen et al. | |

(Continued)

FOREIGN PATENT DOCUMENTS

| | | | | |
|---|---|---|---|---|
| DE | 102019124240 A1 * | 5/2020 | ............. | G01R 27/06 |
| WO | 2022003246 A1 | 1/2022 | | |

*Primary Examiner* — Quochien B Vuong

(57) ABSTRACT

Embodiments of a circuit, system, and method are disclosed. A beam switch to a beam with a beam configuration from another beam with another beam configuration is detected. In response to the detected beam switch: a tuner setting is determined for an antenna tuner of an antenna element in an antenna array which transmits the first beam with the first beam configuration based on the first beam configuration, the tuner setting associated with the first beam configuration; and an indication of the tuner setting is provided to an impedance matching system of the antenna tuner to compensate for a mismatch between an impedance of the antenna element and impedance of one or more other radio frequency (RF) components of an RF front-end having the antenna element and antenna tuner.

23 Claims, 6 Drawing Sheets

(56) References Cited

U.S. PATENT DOCUMENTS

| | | | |
|---|---|---|---|
| 2014/0327594 A1* | 11/2014 | Zhang | H03H 7/40 343/861 |
| 2014/0357200 A1* | 12/2014 | Rousu | H04B 1/0458 455/77 |
| 2019/0214723 A1 | 7/2019 | Zhang et al. | |
| 2019/0348761 A1 | 11/2019 | Miehle | |
| 2019/0372630 A1 | 12/2019 | Brunel et al. | |

* cited by examiner

ANTENNA TUNER FOR A BEAMFORMING ANTENNA ARRAY

BACKGROUND

A base transceiver station (BTS) uses an antenna array to transmit a beam in a specific direction. The beam is formed as a result of a beamforming process and the specific direction is typically toward a physical area where a number of user equipment (UE) is located. In one example, the antenna array transmits multiple beams by multiplexing the multiple beams over time such that at any one instance in time only one beam is transmitted, but over time the multiple beams will service the number of UEs. In another example, the antenna array transmits more than one beam by multiplexing multiple beams at a time such that at any one instance in time more than one beam is transmitted to service the number of UEs. The antenna array comprises a plurality of radio frequency (RF) front-end modules which each have an antenna element and an antenna tuner arranged between the antenna element and other RF components of the RF front-end module. The antenna tuner has an impedance matching system typically based on sections of variable capacitive reactance and/or inductive reactance connected to a transmission line of an RF front-end module. Impedance matching is a process of compensating for mismatch of antenna impedance and impedance of other RF components of the RF front end by the impedance matching system to reduce the mismatch. The impedance matching improves power transfer by a power amplifier and reduces signal reflections in the RF front-end module. Without impedance matching, performance of the RF front-end degrades due to non-optimal load conditions.

BRIEF DESCRIPTION OF THE DRAWINGS

Throughout the description, similar reference numbers may be used to identify similar elements.

DETAILED DESCRIPTION

Figure 1:
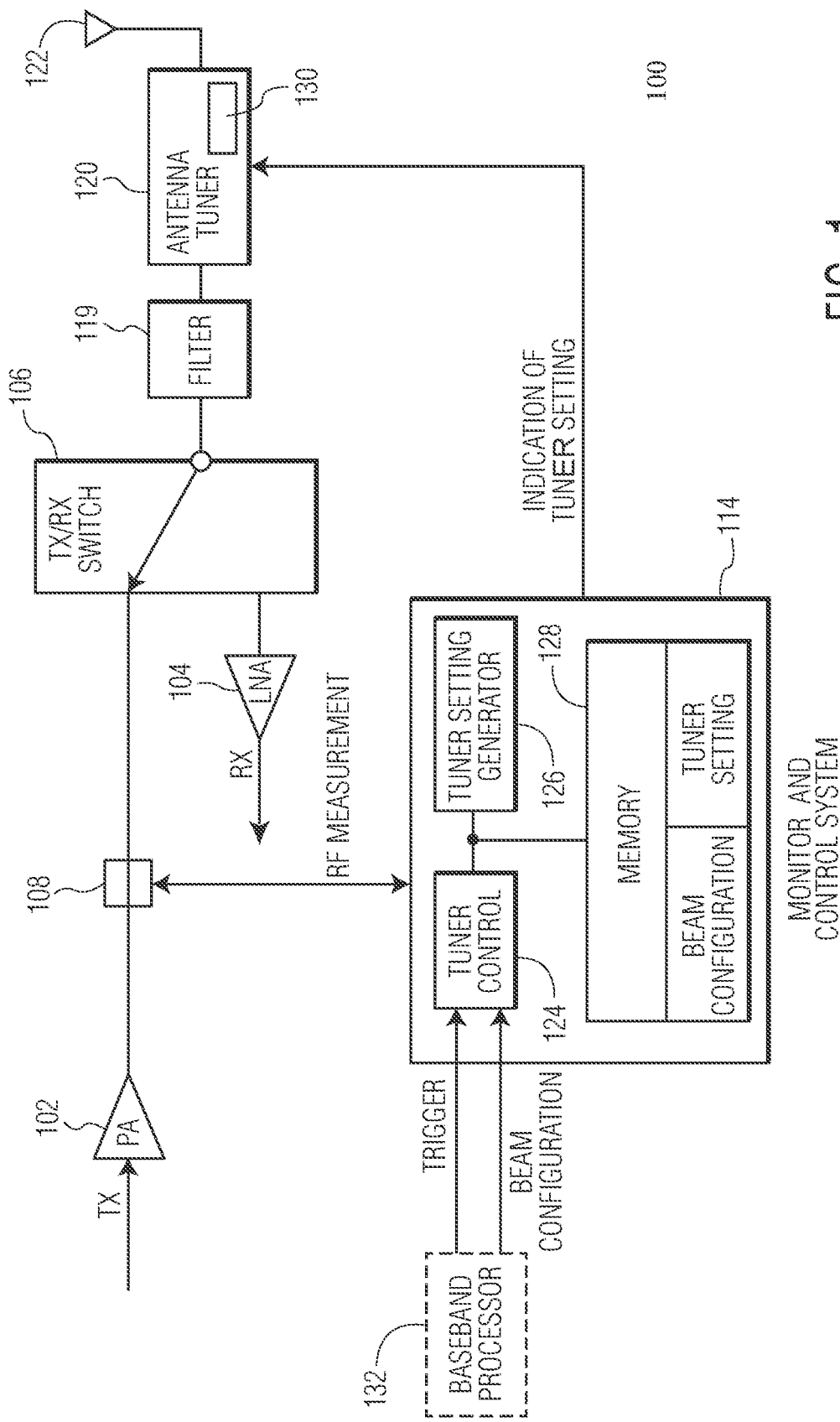
FIG. 1 is an example block diagram of an example RF front-end.

Embodiments described herein are directed to a method, system, and apparatus for antenna tuning. A beam transmitted by an antenna array in a certain direction has a beam configuration. In examples, the antenna array transmits a beam with a first beam configuration and then switches to transmit a beam with a second beam configuration. When the antenna array switches from transmitting a beam with the first beam configuration to transmitting the beam with a second beam configuration (i.e., "beam switch"), an antenna tuner coupled to an antenna element of the antenna array compensates for impedance mismatch between antenna element and other radio frequency (RF) components of an RF front-end as a result of the beam change. Impedance matching is a process of compensating for mismatch of antenna impedance and impedance of other RF components of the RF front end by the antenna tuner to reduce the mismatch. In response to the beam switch, a control system determines a tuner setting for the antenna tuner. The control system then provides an indication of the tuner setting to the antenna tuner which causes an impedance of the antenna tuner to be adjusted based on the tuner setting.

Impedance matching quality data (or "matching quality data") indicates a level of impedance match between the impedance of the antenna element and impedance of the other RF components of the RF front-end 100 and is determined based on the adjusted impedance and the transmission of the beam with the beam configuration. The determined tuner setting is then updated based on the impedance matching quality data. A next time that the antenna array transmits the beam with the second beam configuration, the control system provides an indication of the updated tuner setting to the antenna tuner which compensates for the impedance mismatch. A process of measuring quality of the compensation and updating the tuner setting is repeated such that the tuner setting converges to a final tuner setting used to compensate for the impedance mismatch when the antenna array performs a beam switch to transmit the beam with the second beam configuration.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "an example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

FIG. 1 is an example block diagram of an example RF front-end 100 that includes a transmit signal power amplifier (PA) 102, a receive signal low noise amplifier (LNA) 104, a transmitter/receiver switch (Tx/Rx switch) 106, a directional coupler 108, a monitoring and control system 114, a bandpass filter 119, an antenna tuner 120, and an antenna element 122. In a transmit operation, the Tx/Rx switch 106 is set to a transmit state (as shown in FIG. 1) and a transmit signal (Tx) is passed to the power amplifier 102, through the directional coupler 108, through the Tx/Rx switch 106, through the bandpass filter 119 which reduces or suppresses certain frequency ranges in the Tx signal outside a transmit frequency range, through the antenna tuner 120, and to the antenna element 122 for transmission. In a receive operation, the Tx/Rx switch 106 would be set to a receive state (not shown in FIG. 1) and a receive signal (Rx) would be passed from the antenna element 122, through the antenna tuner 120, though the bandpass filter 119 which reduces or suppresses certain frequency ranges in the Rx signal outside a receive frequency range, through the Tx/Rx switch 106, and through the low noise amplifier 104. The directional coupler 108 may facilitate monitoring one or more of an incident power, incident phase, voltage, or current of the RF signal of the Tx signal and reflected power, reflected phase, voltage, or current resulting from the Tx signal. Another embodiment uses a circulator instead of or in addition to the Tx/Rx 106 switch to route the Tx signal and the Rx signals to and from the antenna element 122 and provide isolation. In this embodiment, reflected signals may be also monitored during the receive operation.

A plurality of RF front-ends 100 arranged together may form an antenna array (not shown) which transmits or receives a plurality of RF signals. The RF signals may each have a phase and amplitude which constructively add or destructively add to concentrate energy to form a beam transmitted by the antenna array in a certain direction with a larger strength in the certain direction.

The beam formed based on the RF signal may have a beam configuration. The beam configuration may characterize one or more of a phase, amplitude, and direction of the beam. In examples, the direction is typically toward a specific physical area where a number of user equipment (UE) is located. The antenna array may further transmit beams with different beam configurations. Each time the antenna array transmits a beam with a different beam configuration, impedance of the antenna element 122 may no longer match other RF components of the RF front-end 100 associated with the antenna element 122. The impedance may not also match due to external conditions such as temperature and humidity. Impedance matching as defined herein is a process of compensating for the mismatch between the impedance of the antenna element 122 and impedance other RF components in the RF front-end 100 to reduce the mismatch. The mismatch may be measured by the directional coupler 108. When the directional coupler 108 is arranged on the PA side of the Tx/Rx switch 106 as shown, the measurements by the directional coupler 108 indicate mismatch between (i) the impedance of the antenna element 122 and Tx/Rx switch 106 and (ii) other RF components in the RF front-end. Even though impedance of the Tx/Rx switch 106 is considered in this arrangement, most of the variation in impedance is due to the antenna element 122 such that the mismatch considered is between the impedance of the antenna element 122 and impedance other RF components in the RF front-end 100. When the directional coupler 108 is arranged on the antenna side of the Tx/Rx switch 106 which is not shown, the measurements by the directional coupler 108 indicate mismatch between the impedance of the antenna element 122 and other RF components in the RF front-end. Without impedance matching, performance of the RF front-end 100 degrades due to non-optimal load conditions.

The antenna tuner 120 has an impedance matching system 130 typically based on sections of variable capacitive reactance and/or variable inductive reactance connected to a transmission line of the RF front-end 100. The impedance of the antenna tuner 120 may be adjusted based on adjustment of the variable capacitive reactance or variable inductive reactance of the antenna tuner 120 to compensate for the mismatch.

The monitoring and control system 114 may control the antenna tuner 120 to adjust impedance and compensate for the mismatch. The monitoring control system 114 may be implemented as a standalone unit or integrated in one or more components of the RF front-end 100 (including the antenna tuner 120) or a baseband processor 132 associated with baseband processing upstream from the RF front-end 100. To facilitate the control by the monitoring and control system 114, the monitoring and control system 114 may have a tuner control 124 and a memory 128. In examples, the antenna array transmitting a beam with a first beam configuration switches to transmitting a beam with a second beam configuration. The tuner control 124 may receive an indication of the second beam configuration. The baseband processor 132 may provide the indication of the second beam configuration and in examples the beam configuration may be uniquely identified by a uniquely assigned index number or angle of the beam. For example, the memory 128 may store a respective tuner setting for each of a plurality of beam configurations to compensate for the mismatch where each tuner setting should result in a close match between (i) the impedance of the antenna element and antenna tuner and (ii) impedance of the other RF components of the RF front-end for the respective beam configuration. In examples, the tuner setting may be a bias voltage to control tunable capacitors of the antenna tuner 120 or a switch setting to switch in or out one or more capacitors for the beam configuration. The tuner control 124 may also receive a trigger from the baseband processor 132 which causes the tuner control 124 to provide an indication of the tuner setting to the antenna tuner 120.

The monitoring and control system 114 may also have a tuner setting generator 126 to update the tuner setting stored in the memory 128 to improve the impedance matching. The tuner setting generator 126 may determine the mismatch when the beam with the second beam configuration is transmitted. Impedance matching quality data (or "matching quality data") indicates a level of impedance match between the impedance of the antenna element and the impedance of the other RF components of the RF front-end 100 and is determined based on the adjusted impedance and the transmission of the beam with the beam configuration. The tuner setting generator 126 may receive matching quality data associated with the impedance matching such as RF measurements which may include one or more of the incident power, reflected power, incident phase, reflected phase, voltage, current, or a reflection coefficient from the directional coupler 108. Based on the matching quality data, the tuner setting generator 126 may update the tuner setting stored in the memory 128 for when the beam with the second configuration is transmitted so that impedance matching improves. The next time the tuner control 124 detects the same beam configuration, an indication of the tuner setting may be provided to the antenna tuner 120 to perform the impedance matching such that iteratively over time the impedance matching may improve.

Figure 2:
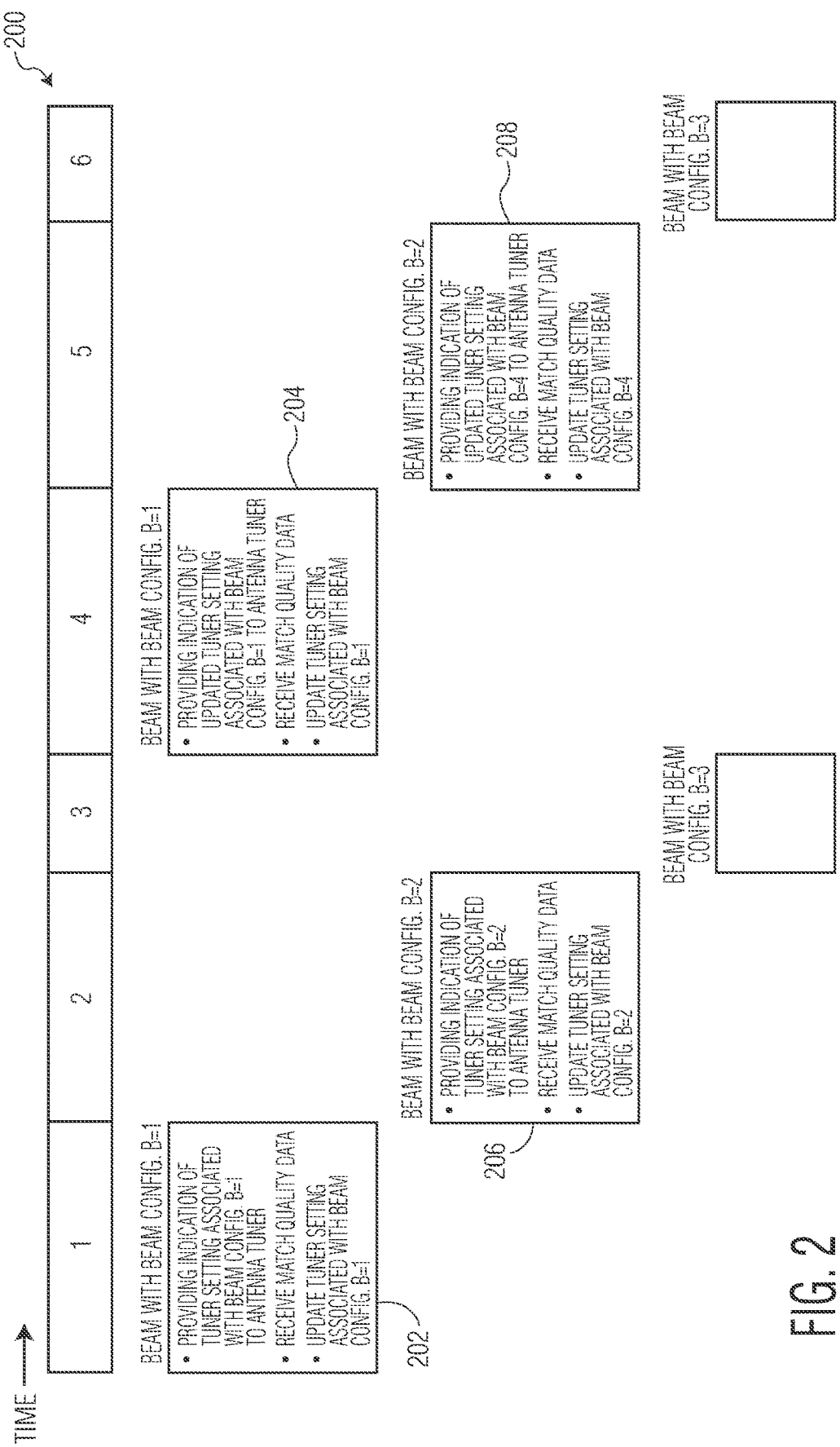
FIG. 2 illustrates an example multiplex of beams and processing performed by the tuner control.

FIG. 2 illustrates an example multiplex 200 of beams transmitted by the antenna array in time and processing performed by the monitor and control system 114 to improve impedance matching in the RF front-end 100. The antenna array may transmit three different beams in this example which are multiplexed in time (i.e., each beam is active during one of six consecutive timeslots 1 to 6). Of course, over time, the antenna array may transmit significantly more than three different beams.

A first beam may have a beam configuration B=1. A beam is an electromagnetic signal with a signal strength that is stronger in a particular direction. The beam configuration defines one or more characteristics of the beam such that beams with different beam configurations are considered different beams. The beam with the beam configuration B=1 may be encountered during timeslot 1 and later during timeslot 4. Functionality of the tuner control 124 associated with beam configuration B=1 during timeslot 1 is shown in block 202. The tuner control 124 may store in memory 128 a tuner setting associated with beam configuration B=1. The tuner control 124 may provide an indication of the tuner setting associated with beam configuration B=1 to the antenna tuner 120 to compensate for the mismatch between the impedance of the antenna element 122 and impedance other RF components in the RF front-end 100 for beam configuration B=1. Further, the tuner control 120 may receive matching quality data associated with beam configuration B=1 from the directional coupler 108 and update the tuner setting associated with beam configuration B=1. The updated tuner setting associated with the beam configuration B=1 may be used during a next timeslot that the beam with beam configuration B=1 is encountered which is during timeslot 4 in the illustrated example. Functionality of the tuner control 124 associated with beam configuration B=1 during timeslot 4 is shown in block 204. The tuner control 124 may provide an indication of the updated tuner setting associated with beam configuration B=1 during timeslot 1 to the antenna tuner 120. With the updated tuner setting which is provided, the mismatch between the impedance of the antenna element 122 and impedance other RF components in the RF front-end 100 is compensated for the fourth beam with the beam configuration B=1. Further, the tuner control 120 may receive matching quality data (e.g., indications of forward or reflected power) from the directional coupler 108 during the timeslot and when the matching quality data indicates that the impedance matching is not acceptable (e.g., the reflected power magnitude is higher than a predefined threshold), the tuner control 120 may further update the tuner setting associated with beam configuration B=1 by revising the tuner settings stored in memory 128 for the beam configuration B=1. Each timeslot the beam with the beam configuration B=1 is encountered, the tuner setting may be updated and impedance matching may improve by utilizing the updated tuner setting.

This process may be repeated for other beams with different beam configurations. For example, a second beam may have a beam configuration B=2. The beam with the beam configuration B=2 may be encountered during timeslot 2 and later during timeslot 5. Functionality of the tuner control 124 associated with the beam configuration B=2 during timeslot 2 is shown in block 206. The tuner control 124 may store in memory 128 a tuner setting associated with the beam configuration B=2. The tuner control 124 may provide an indication of the tuner setting associated with beam configuration B=2 to the antenna tuner 120 to compensate for the mismatch between the impedance of the antenna element 122 and impedance of other RF components in the RF front end 100 for beam configuration B=2. Further, the tuner control 120 may receive matching quality data associated with the beam configuration B=2 from the directional coupler 108 and update the tuner setting associated with the beam configuration B=2 when the matching quality data indicates that the impedance matching is not acceptable. The updated tuner setting associated with the beam configuration B=2 may be used during a next timeslot that the beam with beam configuration B=2 is encountered which is during timeslot 5 in the illustrated example. Functionality of the tuner control 124 associated with the beam configuration B=2 during timeslot 5 is shown in block 208. The tuner control 124 may provide an indication of the updated tuner setting associated with beam configuration B=2 during timeslot 2 to the antenna tuner 120. With the updated tuner setting which is provided, the mismatch between the impedance of the antenna element 122 and impedance other RF components in the RF front-end 100 is compensated for a fifth beam with the beam configuration B=2. Further, the tuner control 120 may receive impedance matching quality data from the directional coupler 108 and when the matching quality data indicates that the impedance matching is not acceptable, may further update the tuner setting associated with the beam configuration B=2 by revising the tuner settings stored in the memory 128 for the beam configuration B=2 during timeslot 5. Each time the beam with the beam configuration B=2 is encountered, the tuner setting is updated and an impedance matching may improve based on the updated tuner setting.

A similar process may be performed for yet a third beam during timeslot 3 and timeslot 6 with a beam configuration B=3 and other beams. The tuner setting may be continuously tuned based on the beam configuration improving the impedance matching each time a beam with a beam configuration is encountered.

Figure 3:
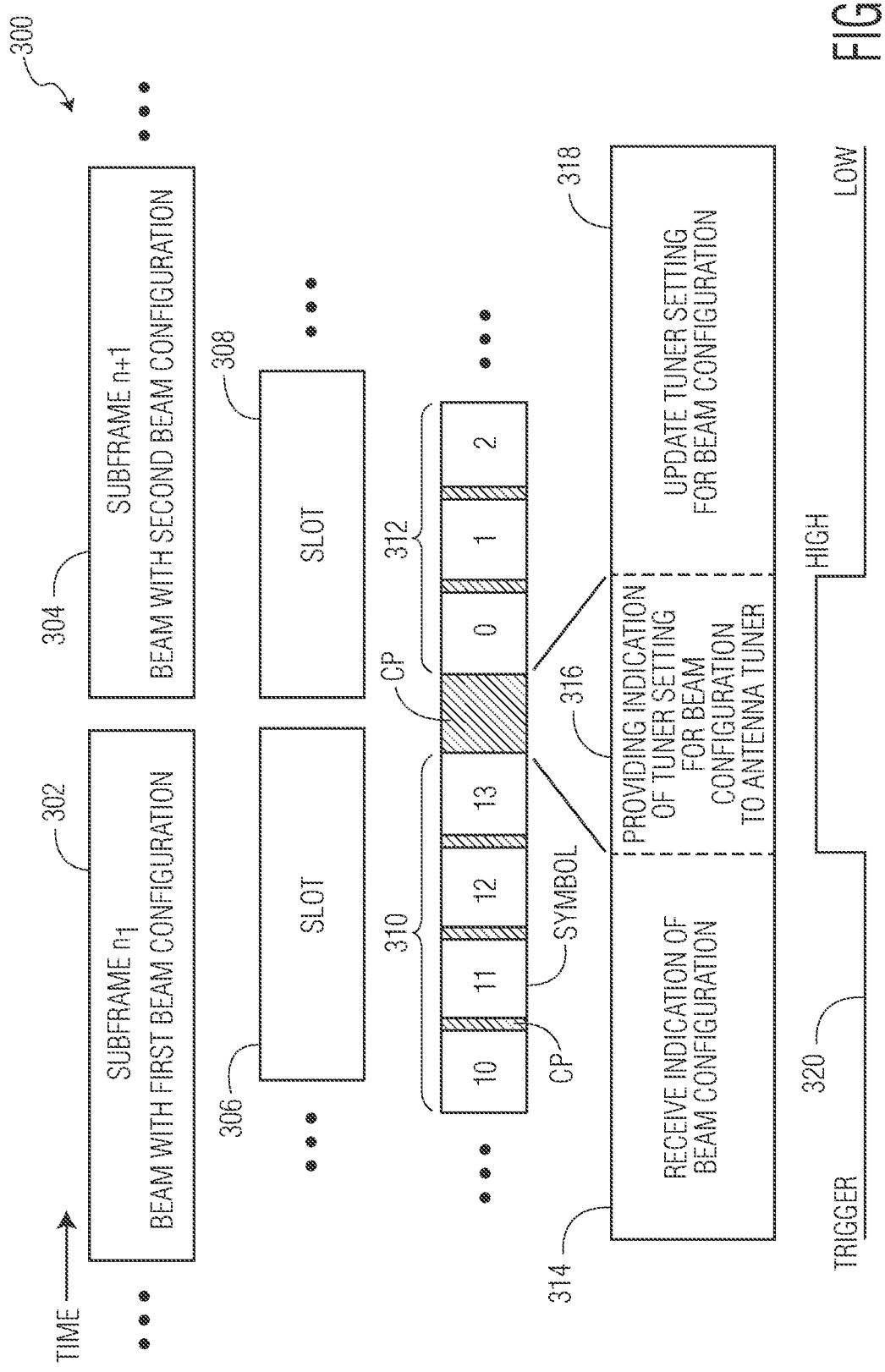
FIG. 3 illustrates an example timing of the processing performed by the tuner control during a beam switch.

FIG. 3 illustrates an example timing 300 of processing performed by the tuner control (e.g., tuner control 124, FIG. 1) during a beam switch from one beam configuration to another beam configuration. The beam switch may be a transition from the antenna array transmitting a beam with a first beam configuration to transmitting a beam with a second configuration.

A data stream may be indicated as subframes 302, 304 where a subframe n defines data to be communicated during a first timeslot during which a beam with a first beam configuration is implemented, and another subframe n+1 defines data to be communicated during a second timeslot during which a beam with a second beam configuration different from the first beam configuration is implemented. Each subframe may be transmitted in a variable number of timeslots over a duration of 1 millisecond, for example. Each subframe is communicated during one or more slots (i.e., consecutive portions of a timeslot) which each are used to transmit one or more data symbols. The one or more slots may be one, two, four, eight, or sixteen slots depending on a format of a subframe and the number of data symbols communicated during a slot may be between one to fourteen symbols in an example. In the timing 300, one slot 306 during which one or more first symbols are communicated, and one slot 308 during which one or more second symbols are communicated are shown along with a portion of symbols 310 labeled as 10 to 13 communicated during slot 306 and symbols 312 labeled as 0 to 2 communicated during slot 308. A sequence of symbols carries information such as data bits and comprises a cyclic prefix (CP) and an orthogonal frequency division multiplexing (OFDM) symbol. The purpose of the CP is to act as a guard or buffer between adjacent OFDM symbols.

The first CP communicated during slot 308 (e.g., depicted to the left of and adjacent to symbol number 0) may have a duration, for example, of one microsecond, and this first CP may be slightly longer than the other CPs communicated during the same slot—different slots could mean different devices, thus warranting a larger guard time. In examples, the impedance matching may be performed during transmission of the first CP in a slot associated with a particular beam (e.g., a beam with the second beam configuration). Prior to the first CP in the slot 308 (e.g., during slot 306), the tuner control 124 may receive an indication of a beam switch from a beam with a first beam configuration to a beam with a second beam configuration during time 314. A baseband processor 132 may send the indication to the tuner control 124. Based on the second beam configuration, the tuner control 124 may access the memory 128 and retrieve the tuner setting associated with the beam with the second beam configuration. The tuner control may then receive a trigger 320 before or during the first CP of the slot which transitions, e.g., from a low state to a high state, to indicate to the tuner control 124 to provide an indication of the second beam configuration's tuner setting to the antenna tuner 120. The trigger 320 may also indicate that the beam will be switched to the second beam configuration. During time 316, the tuner control 124 may provide the indication with the tuner setting to the antenna tuner 120 which causes the antenna tuner 120 perform an impedance matching to compensate for the mismatch associated with transmission of the beam with the second beam configuration.

After a period of time, the trigger 320 transitions from the high state back to the low state which indicates that the antenna array is transmitting the beam with the second beam configuration. The tuner setting generator 126 may measure the matching quality data. The matching quality data may include one or more of forward power, reflected power, forward phase, reflected phase, voltage, current, or a reflection coefficient. During time 318, the tuner control 124 may update the tuner setting for the beam with the second beam configuration based on the matching quality data so that if an indication of the updated tuner setting is subsequently provided to the antenna tuner 120, the impedance matching may improve for the second beam configuration. The indication may be then provided to the antenna tuner 120 the next time that there is a beam switch from a beam which does not have the second beam configuration to the beam with the second beam configuration.

Figure 4:
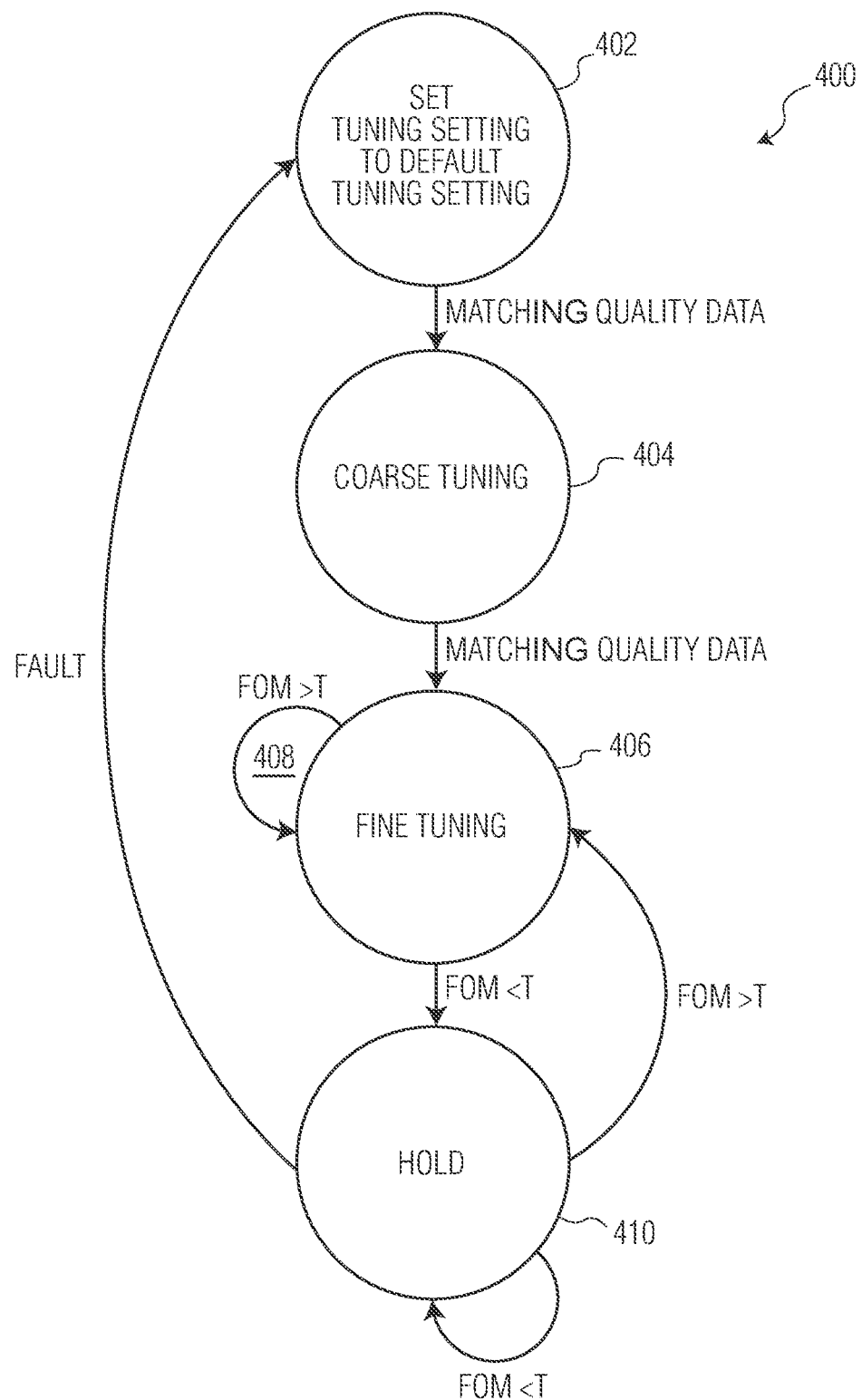
FIG. 4 is an example of processing to manage a tuner setting associated with a beam having a beam configuration.

FIG. 4 is an example of processing 400 to determine a tuner setting of the antenna tuner 120 for a beam having a beam configuration. The processing 400 may comprise the tuner control 124 transitioning between various processing states 402-410 to determine the tuner setting and provide an indication of the tuner setting to the antenna tuner 120 to compensate for the impedance mismatch each time there is a beam switch to the beam having the beam configuration. Processing 400 may be performed for one type of beam configuration to determine an associated tuner setting to compensate for the impedance mismatch for the beam configuration.

At processing state 402, the tuner setting may be initially set to a default tuner setting for a beam having a beam configuration being transmitted by the antenna array. The default tuner setting may be an estimate of the tuner setting to achieve an acceptable impedance matching for the beam with the beam configuration (e.g., an impedance matching associated with a reflected power below a threshold). The default tuner setting may be defined based on an ideal design and operation of the antenna element 122 and frequency band of the beam with the beam configuration, or may be determined in the field during deployment of the RF front end module 100. The tuner control 124 may provide an indication of the default tuner setting to the antenna tuner 120 during a beam switch to the beam having the beam configuration.

The tuner setting generator 126 may receive matching quality data associated with the beam with the beam configuration. In an example, the matching quality data may be associated with the impedance matching such as RF measurements which may include one or more of the incident power, reflected power, incident phase, reflected phase, voltage, current, or a reflection coefficient from the directional coupler 108. Based on the matching quality data, the tuner setting may be updated based on a coarse tuning at processing state 404. In an example, the coarse tuning may use the matching quality data to determine a near optimal tuner setting that produces a near optimal impedance matching (e.g., an impedance matching associated with a low or negligible reflected signal magnitude). The matching quality data may be used to calculate a reflection coefficient indicative of an impedance match. A Smith chart may identify various tuner settings of the antenna tuner and associated reflection coefficients. The near optimal tuner setting may be a tuner setting associated with a point in the Smith chart with a reduced reflection coefficient from the calculated reflection coefficient and produces the near optimal impedance matching. Additionally, or alternatively, the near optimal tuner setting may be a setting associated with a point in the Smith chart that does not minimize reflections but produces desired performance criteria of the power amplifier such as maximum power (Pmax), efficiency, or linearity. The performance criteria for the power amplifier may change as a function of frequency of operation, traffic state, temperature, and other dynamic conditions. The optimal tuner setting may be different for transmit and receive operation. The tuner control 124 may provide an indication of the near optimal tuner setting to the antenna tuner 120 during a beam switch to the beam having the beam configuration.

The tuner setting generator 126 may again improve the impedance matching. The tuner setting generator 126 may receive matching quality data. The antenna tuner 120 may not be operating under ideal conditions. For example, environmental conditions may affect the impedance matching. Based on the matching quality data, the tuner setting generator 126 may update the tuner setting based on a fine tuning at processing state 406 to account for the non-ideal conditions. The fine tuning may involve updating the tuner setting to a predefined tuner setting in proximity to the near optimal tuner setting as an update to the tuner setting. The predefined tuner setting may be a tuner setting of a plurality of tuner settings in a Smith chart 500 shown in FIG. 5 on a path to a final tuner setting which results in a final impedance matching.

The tuner control 114 may provide the updated tuner setting to the antenna tuner 120 during a beam switch to the beam having the beam configuration (e.g., during a CP or other period between or spanning consecutive timeslots). The tuner setting may be further finely tuned as an iteration of the fine tuning based on additional matching quality data and a figure of merit (FOM). In examples, the FOM may be an error in a reflection coefficient from a desired reflection coefficient and may be calculated based on the matching quality data and compared to a threshold. The reflection coefficient and/or the desired reflection coefficient used in the FOM calculation may be real or complex. If the FOM is greater than or equal to a threshold, then processing transitions to processing state 408 and the tuner setting is updated by selecting another tuner setting associated with a point in the Smith chart with a reflection coefficient that reduces the FOM. Each time the tuner setting is updated and an indication is provided to the antenna tuner 120 during a beam switch to the beam having the beam configuration, an impedance match may improve. If the FOM is less than a threshold, then processing transitions to processing state 410 and the tuner setting is no longer adjusted and a final tuner setting is provided to the antenna tuner 120 during a beam switch to the beam having the beam configuration. Further, if a fault condition occurs such as the matching quality data is invalid or not received for a period of time such as 400 milliseconds associated with a handoff, then processing 400 returns back to processing state 402 and the tuner setting is reset with the default state and coarse and fine tuning is restarted. If the FOM is greater than a threshold after being less than a threshold at processing state 408, then the tuner setting is finely tuned at processing state 406. Additional or different transitions between states are also possible.

Figure 5:
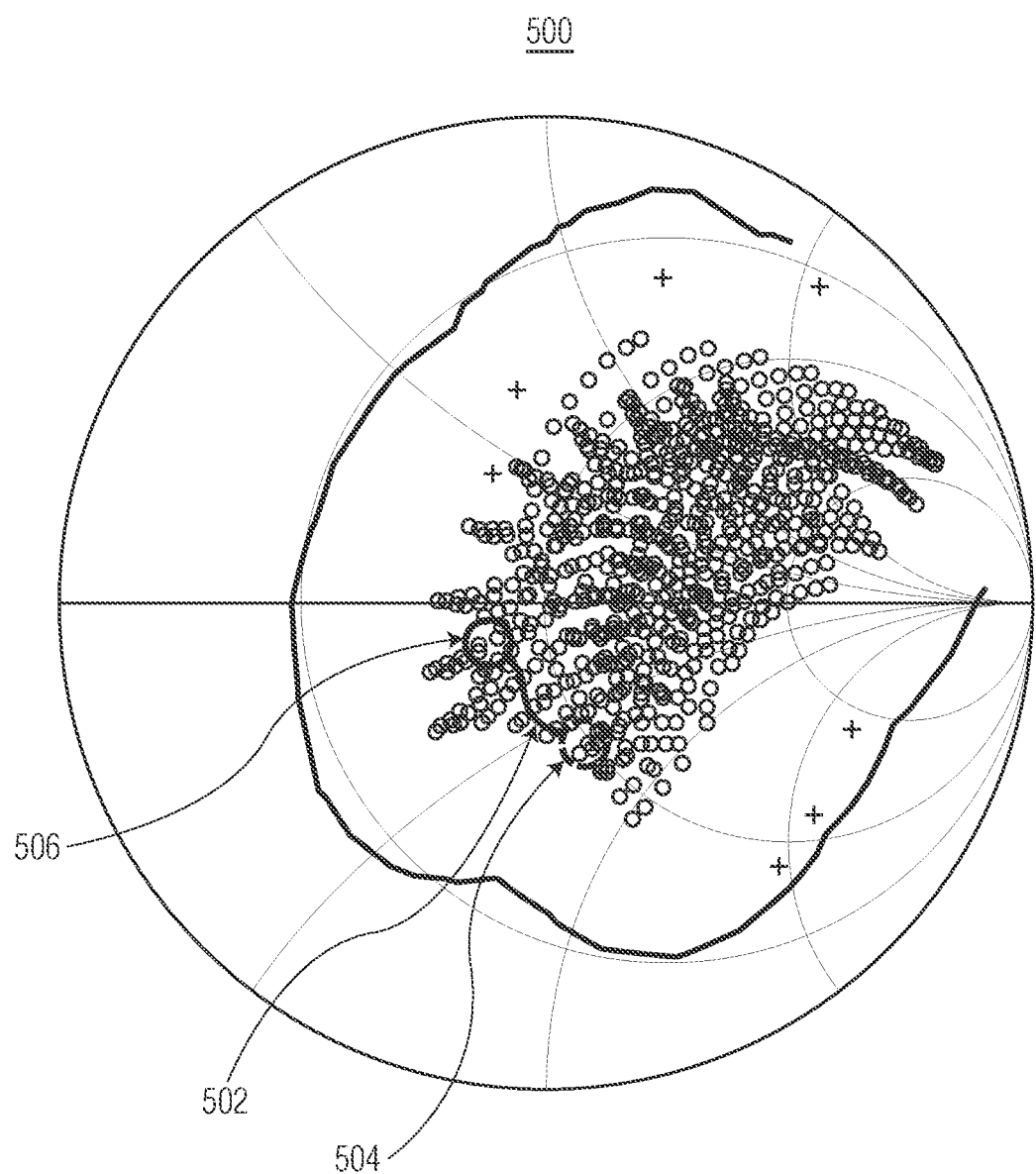
FIG. 5 is an example of a Smith chart associated with defining the tuner setting.

FIG. 5 is an example of the Smith chart 500 which indicates tuner settings for an antenna tuner 120 to achieve a certain impedance match between the impedance of the antenna element 122 and the antenna tuner 120 and the impedance of the other RF components of the RF front end 100. A center of the Smith chart may be associated with a tuner setting with an impedance matching of 50 ohms under ideal conditions. Each discrete point in the Smith chart is associated with a tuner setting and a reflection coefficient associated with the tuner setting. The antenna tuner 120 may take on tuner settings associated with points in the Smith chart along a path 502 from a first point associated with an initial tuner setting 504 to a second point associated with a final tuner setting 506 over a plurality of iterations in the processing 400 where each of the tuner settings on the path 502 may improve the impedance match such that the reflection coefficient approaches zero. If the optimal reflection coefficient is nonzero then the algorithm may improve the impedance match such that the reflection coefficient approaches the optimal reflection coefficient. In examples, the tuner settings and reflection coefficient associated with the tuner settings in the Smith chart 500 may be defined based on an ideal design and operation of the antenna element 122 and frequency band of the beam with the beam configuration as a result of simulations or a testing process.

Figure 6:
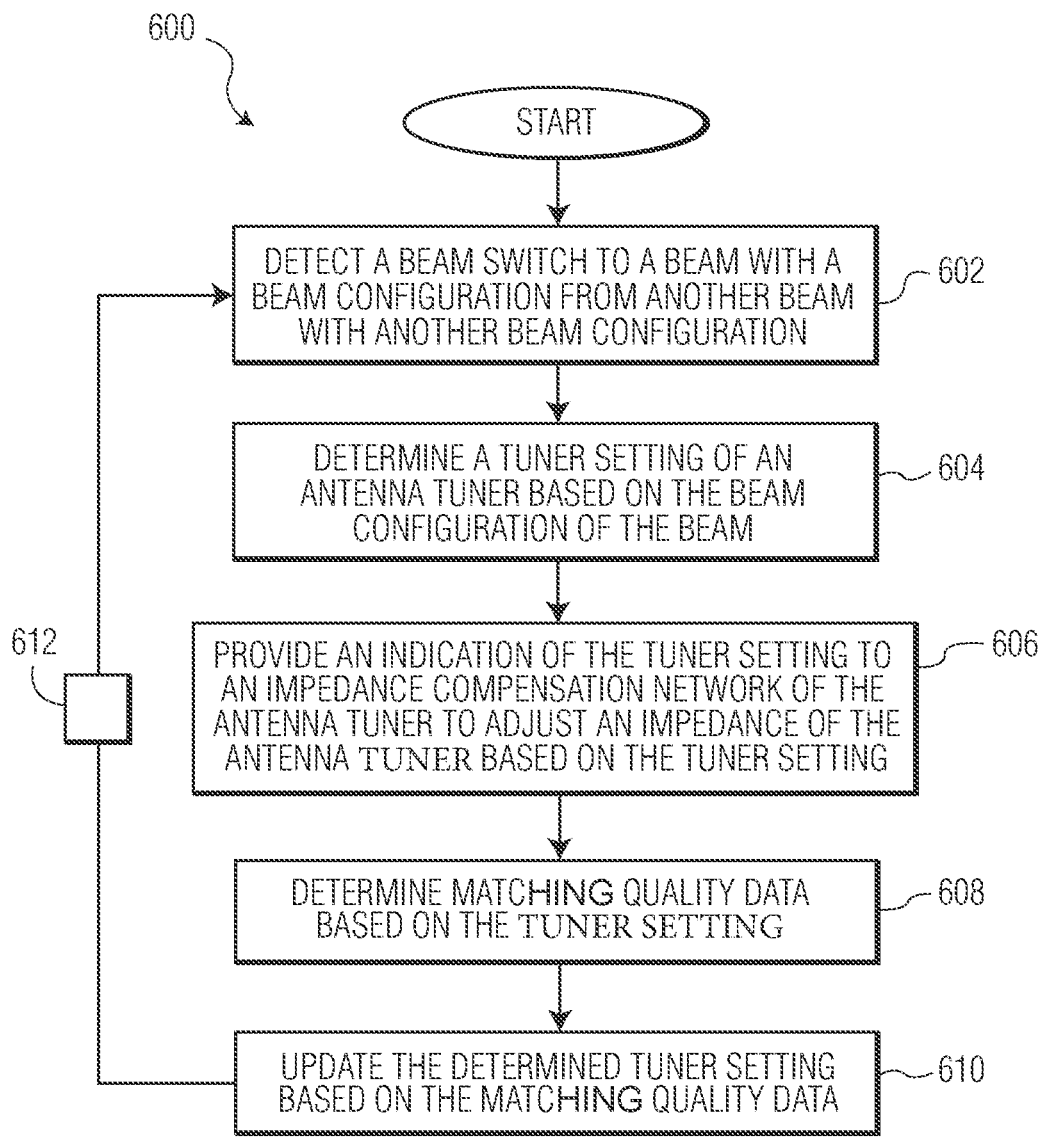
FIG. 6 is an example flow chart of functions associated with the antenna tuner.

FIG. 6 is an example flow chart of functions 600 associated with the antenna tuner. At step 602, a beam switch to a beam with a beam configuration from another beam with another beam configuration is detected. The beam switch may be associated with transmission or reception of a beam. For example, the tuner control receives an indication of a beam switch to the beam configuration from a baseband processor 132. At step 604, a tuner setting of an antenna tuner 120 is determined based on (e.g., in response to) the beam configuration of the beam. The memory 128 may store a mapping of the beam configuration to the tuner setting. At step 606, an indication of the tuner setting is provided to an impedance matching system 130 of the antenna tuner which adjusts an impedance of antenna tuner by modifying the settings of one or more variable capacitive and/or inductive elements of the impedance matching system 130 to compensate for the impedance mismatch between the impedance of the antenna element 122 and the impedance of the other components of the RF front-end 100. The indication is provided after a time that the antenna array transmits the other beam with the other beam configuration and before the antenna array transmits the beam with the beam configuration. In some examples, the indication is provided to a digital to analog converter which generates a bias voltage to adjust a variable component value in the antenna tuner 120, and thus compensate for the impedance mismatch. At step 608, matching quality data is determined based on the tuner setting. The matching quality data is determined after the antenna array transmits the beam with the beam configuration. At step 610, the determined tuner setting is adjusted based on the matching quality data for the beam with the beam configuration. The tuner setting may be initially a default tuner setting which is further updated over a plurality of iterations each time a beam switches to the beam with the beam configuration as described herein based on the coarse and fine tuning. At step 612, processing returns back to step 602 to detect the beam switch of the beam to the beam configuration again and the process repeated to improve the match between the impedance of the antenna 122 and the other components of the RF front-end for the beam with the beam configuration. By performing the steps 602-612 for different beam configurations, a tuner setting is determined for each beam configuration and the monitoring and control system 114 stores and refines a respective tuner setting for each of a plurality of beam configurations.

In some examples, a base station transmits a beam with a beam configuration to a user equipment (UE) and an RF front-end 100 of an antenna array of the base station adjusts a tuner setting for the beam configuration. The UE may also transmit an RF signal to the base station which is received by the RF front-end 100. The RF front-end 100 may also adjust the tuner setting to receive the RF signal from the UE. The tuner setting may be based on the tuner setting used when the base station transmits the beam with the beam configuration to the UE. The monitoring and control system 114 may receive an indication that the UE is to transmit the RF signal to be received by the RF front-end 100. The indication may be provided by the baseband processor 132, sensed by a configuration of the Tx/Rx switch 106, and/or based on state information accessible to the RF front-end 100. The indication may also include the beam configuration for transmitting a beam to the UE. The RF front-end 100 may adjust the tuner setting based on the beam configuration as described herein to improve directional sensitivity in a receive direction by the base station.

In one embodiment, a method is disclosed. The method comprises: detecting a beam switch to a first beam with a first beam configuration from a second beam with a second beam configuration; and in response to the detected beam switch: determining a tuner setting for an antenna tuner of an antenna element in an antenna array which transmits the first beam with the first beam configuration based on the first beam configuration, the tuner setting associated with the first beam configuration; and providing an indication of the tuner setting to an impedance matching system of the antenna tuner to compensate for a mismatch between an impedance of the antenna element and impedance of one or more other radio frequency (RF) components of an RF front-end having the antenna element and antenna tuner. In an embodiment, the method further comprises: determining impedance matching quality data indicative of an impedance match between the impedance of the antenna element and the impedance other RF components of the RF front-end by adjustment of impedance of the impedance matching system; and updating the determined tuner setting for the first beam configuration based on the impedance matching quality data. In an embodiment, updating the determined tuner setting based on the impedance matching quality data comprises updating the determined tuner setting based on a figure of merit associated with the impedance matching quality data not meeting a threshold. In an embodiment, the impedance match for the antenna element is adjusted after a time that the antenna array transmits the second beam with the second beam configuration and before the antenna array transmits the first beam with the first beam configuration. In an embodiment, the adjustment is during transmission of a cyclic prefix which precedes transmission of a first data symbol in a slot during which at least a portion of a subframe is transmitted using the first beam with the first beam configuration. In an embodiment, providing the indication of the tuner setting to the antenna tuner comprises providing the indication based on a trigger signal from a baseband processor which indicates the beam switch to the first beam with the first beam configuration from the second beam with the second beam configuration. In an embodiment, the tuner setting indicates an adjustment to the impedance of the antenna tuner.

In another embodiment, a radio frequency (RF) front-end is disclosed. The RF front end comprises: an antenna element; an antenna tuner; a tuner control arranged with circuitry to perform the functions of: detect a beam switch to a first beam with a first beam configuration from a second beam with a second beam configuration; and in response to the detected beam switch: determine a tuner setting for the antenna tuner of the antenna element in an antenna array which transmits the first beam with the first beam configuration based on the first beam configuration; and provide an indication of the tuner setting to an impedance matching system of the antenna tuner to compensate for a mismatch between an impedance of the antenna element and impedance of one or more other radio frequency (RF) components of an RF front-end having the antenna element and antenna tuner. In an embodiment, the tuner control is further arranged with circuitry to perform the functions of: determine impedance matching quality data indicative of an impedance match between the impedance of the antenna element and the impedance other RF components of the RF front-end by adjustment of impedance of the impedance matching system; and update the determined tuner setting for the first beam configuration based on the impedance matching quality data. In an embodiment, the circuitry to update the determined tuner setting based on the impedance matching quality data comprises circuitry to update the determined tuner setting based on a figure of merit associated with the impedance matching quality data not meeting a threshold. In an embodiment, the impedance match for the antenna element is adjusted after a time that the antenna array transmits the second beam with the second beam configuration and before the antenna array transmits the first beam with the first beam configuration. In an embodiment, the adjustment is during a cyclic prefix which precedes transmission of a first data symbol in a slot during which at least a portion of a subframe is transmitted using the first beam with the first beam configuration. In an embodiment, the circuitry to provide the indication of the tuner setting to the antenna tuner comprises circuitry to provide the indication based on a trigger signal from a baseband processor which indicates the beam switch to the first beam with the first beam configuration from the second beam with the second beam configuration. In an embodiment, the RF front-end further comprises a memory which stores the tuner setting associated with the beam configuration.

In yet another embodiment, a control system is disclosed. The control system is arranged with circuitry to: detect a beam switch to a first beam with a first beam configuration from a second beam with a second beam configuration; and in response to the beam switch: determine a tuner setting for an antenna tuner of an antenna element in an antenna array which is to transmit the first beam with the first beam configuration; provide an indication of the tuner setting to an impedance matching system of the antenna tuner to compensate for a mismatch between an impedance of the antenna element and impedance of one or more other radio frequency (RF) components of an RF front-end having the antenna element and antenna tuner by adjustment of impedance of the impedance matching system; determine impedance matching quality data indicative of an impedance match between the impedance of the antenna element and the impedance other RF components of the RF front-end; and update the determined tuner setting based on the impedance matching quality data. In an embodiment, the tuner setting is adjusted after a time that the antenna array transmits the second beam with the second beam configuration and before the antenna array transmits the first beam with the first beam configuration. In an embodiment, the adjustment is during transmission of a cyclic prefix which precedes transmission of a first data symbol in a slot during which at least a portion of a subframe is transmitted using the first beam with the first beam configuration. In an embodiment, the circuitry to provide the indication of the tuner setting to the antenna tuner comprises circuitry to provide the indication based on a trigger signal from a baseband processor which indicates a beam switch to the first beam with the first beam configuration from the second beam with the second beam configuration. In an embodiment, the circuitry to update the determined tuner setting based on the impedance matching quality data comprises circuitry to update the determined tuner setting based on a figure of merit associated with the impedance matching quality data not meeting a threshold. In an embodiment, the tuner setting indicates an adjustment to the impedance of the antenna tuner.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

The foregoing description shows or refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method comprising:
   detecting a beam switch to a first beam with a first beam configuration from a second beam with a second beam configuration; and
   in response to the detected beam switch:
      determining a default of a tuner setting for an antenna tuner of an antenna element in an antenna array which transmits the first beam with the first beam configuration based on the first beam configuration, the tuner setting associated with the first beam configuration; and
      providing an indication of the tuner setting to an impedance matching system of the antenna tuner to compensate for a mismatch between an impedance of the antenna element and impedance of one or more other radio frequency (RF) components of an RF front-end having the antenna element and antenna tuner,
   wherein the tuner setting is dynamically updated from the default setting while the first beam is transmitted and reset to the default setting when impedance matching quality data is not received for a predetermined period of time, the tuner setting updated based on the impedance matching quality data and the impedance matching quality data indicative of an impedance match between the impedance of the antenna element and the impedance of other RF components of the RF front-end.

2. The method of claim 1, further comprising:
   determining the impedance matching quality data indicative of the impedance match between the impedance of the antenna element and the impedance other RF components of the RF front-end by adjustment of impedance of the impedance matching system; and
   updating the determined tuner setting for the first beam configuration based on the impedance matching quality data.

3. The method of claim 2, wherein updating the determined tuner setting based on the impedance matching quality data comprises updating the determined tuner setting based on a figure of merit associated with the impedance matching quality data not meeting a threshold.

4. The method of claim 1, wherein the impedance match for the antenna element is adjusted after a time that the antenna array transmits the second beam with the second beam configuration and before the antenna array transmits the first beam with the first beam configuration.

5. The method of claim 4, wherein the adjustment is only during transmission of a cyclic prefix which precedes transmission of a first data symbol in a slot during which at least a portion of a subframe is transmitted using the first beam with the first beam configuration.

6. The method of claim 1, wherein providing the indication of the tuner setting to the antenna tuner comprises providing the indication based on a trigger signal from a baseband processor which indicates the beam switch to the first beam with the first beam configuration from the second beam with the second beam configuration.

7. The method of claim 1, wherein the tuner setting indicates an adjustment to the impedance of the antenna tuner.

8. The method of claim 1, wherein the impedance matching data is forward power, reflected power, forward phase, and reflected phase for the first beam.

9. An radio frequency (RF) front-end comprising:
   an antenna element;
   an antenna tuner;
   a tuner control arranged with circuitry to perform the functions of:
      detect a beam switch to a first beam with a first beam configuration from a second beam with a second beam configuration; and
      in response to the detected beam switch:
         determine a default of a tuner setting for the antenna tuner of the antenna element in an antenna array which transmits the first beam with the first beam configuration based on the first beam configuration; and
         provide an indication of the tuner setting to an impedance matching system of the antenna tuner to compensate for a mismatch between an impedance of the antenna element and impedance of one or more other radio frequency (RF) components of an RF front-end having the antenna element and antenna tuner,
      wherein the tuner setting is dynamically updated from the default setting while the first beam is transmitted and the tuner setting is reset to the default when impedance matching quality data is not received for a predetermined period of time, the tuner setting updated based on the impedance matching quality data and the impedance matching quality data indicative of an impedance match between the impedance of the antenna element and the impedance of other RF components of the RF front-end.

10. The RF front-end of claim 9, wherein the tuner control is further arranged with circuitry to perform the functions of:
   determine the impedance matching quality data indicative of impedance match between the impedance of the antenna element and the impedance other RF components of the RF front-end by adjustment of impedance of the impedance matching system; and update the determined tuner setting for the first beam configuration based on the impedance matching quality data.

11. The RF front-end of claim 10, wherein the circuitry to update the determined tuner setting based on the impedance matching quality data comprises circuitry to update the determined tuner setting based on a figure of merit associated with the impedance matching quality data not meeting a threshold.

12. The RF front-end of claim 9, wherein the impedance match for the antenna element is adjusted after a time that the antenna array transmits the second beam with the second beam configuration and before the antenna array transmits the first beam with the first beam configuration.

13. The RF front end of claim 12, wherein the adjustment is only during a cyclic prefix which precedes transmission of a first data symbol in a slot during which at least a portion of a subframe is transmitted using the first beam with the first beam configuration.

14. The RF front-end of claim 9, wherein the circuitry to provide the indication of the tuner setting to the antenna tuner comprises circuitry to provide the indication based on a trigger signal from a baseband processor which indicates the beam switch to the first beam with the first beam configuration from the second beam with the second beam configuration.

15. The RF front-end of claim 9, further comprising a memory which stores the tuner setting associated with the beam configuration.

16. The RF front-end of claim 9, wherein the impedance matching data is forward power, reflected power, forward phase, and reflected phase for the first beam.

17. A control system arranged with circuitry to:
  detect a beam switch to a first beam with a first beam configuration from a second beam with a second beam configuration; and
  in response to the beam switch:
    determine a default of a tuner setting for an antenna tuner of an antenna element in an antenna array which is to transmit the first beam with the first beam configuration;
    provide an indication of the tuner setting to an impedance matching system of the antenna tuner to compensate for a mismatch between an impedance of the antenna element and impedance of one or more other radio frequency (RF) components of an RF front-end having the antenna element and antenna tuner by adjustment of impedance of the impedance matching system;
    determine impedance matching quality data indicative of an impedance match between the impedance of the antenna element and the impedance other RF components of the RF front-end; and
    update the determined tuner setting based on the impedance matching quality data,
  wherein the tuner setting is dynamically updated from the default setting while the first beam is transmitted and reset to the default setting when impedance matching quality data is not received for a predetermined period of time and the impedance matching quality data indicative of an impedance match between the impedance of the antenna element and the impedance of other RF components of the RF front-end.

18. The control system of claim 17, wherein the tuner setting is adjusted after a time that the antenna array transmits the second beam with the second beam configuration and before the antenna array transmits the first beam with the first beam configuration.

19. The control system of claim 18, wherein the adjustment is only during transmission of a cyclic prefix which precedes transmission of a first data symbol in a slot during which at least a portion of a subframe is transmitted using the first beam with the first beam configuration.

20. The control system of claim 17, wherein the circuitry to provide the indication of the tuner setting to the antenna tuner comprises circuitry to provide the indication based on a trigger signal from a baseband processor which indicates a beam switch to the first beam with the first beam configuration from the second beam with the second beam configuration.

21. The control system of claim 17, wherein the circuitry to update the determined tuner setting based on the impedance matching quality data comprises circuitry to update the determined tuner setting based on a figure of merit associated with the impedance matching quality data not meeting a threshold.

22. The control system of claim 17, wherein the tuner setting indicates an adjustment to the impedance of the antenna tuner.

23. The control system of claim 17, wherein the impedance matching data is forward power, reflected power, forward phase, and reflected phase for the first beam.

* * * * *